(12) United States Patent
Choi

(10) Patent No.: US 8,867,871 B2
(45) Date of Patent: Oct. 21, 2014

(54) OPTICAL PRINTED CIRCUIT BOARD AND METHOD OF FABRICATING THE SAME

(75) Inventor: Jae Bong Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 115 days.

(21) Appl. No.: 13/500,779

(22) PCT Filed: Mar. 24, 2010

(86) PCT No.: PCT/KR2010/001799
§ 371 (c)(1), (2), (4) Date: Jun. 26, 2012

(87) PCT Pub. No.: WO2011/043521
PCT Pub. Date: Apr. 14, 2011

(65) Prior Publication Data
US 2012/0263412 A1    Oct. 18, 2012

(30) Foreign Application Priority Data

Oct. 8, 2009 (KR) .................. 10-2009-0095841
Oct. 9, 2009 (KR) .................. 10-2009-0096271

(51) Int. Cl.
| | |
|---|---|
| G02B 6/12 | (2006.01) |
| H05K 1/02 | (2006.01) |
| G02B 6/43 | (2006.01) |
| H01L 23/00 | (2006.01) |
| H05K 1/18 | (2006.01) |
| H05K 3/46 | (2006.01) |

(52) U.S. Cl.
CPC *G02B 6/43* (2013.01); *H05K 1/185* (2013.01); *H01L 2924/01005* (2013.01); *H01L 2924/01029* (2013.01); *H01L 2924/014* (2013.01); *H01L 2224/48227* (2013.01); *H05K 1/0274* (2013.01); *H01L 2924/01033* (2013.01); *H01L 2224/73265* (2013.01); *H01L 2924/15192* (2013.01); *H01L 24/24* (2013.01); *H05K 3/4602* (2013.01); *H01L 2224/32225* (2013.01); *H01L 2224/24227* (2013.01)
USPC .............................................. 385/14

(58) Field of Classification Search
None
See application file for complete search history.

(56) References Cited

U.S. PATENT DOCUMENTS

| | | | |
|---|---|---|---|
| 6,243,509 B1 | 6/2001 | Chen | |
| 7,062,144 B2 * | 6/2006 | Hwang et al. | 385/139 |

(Continued)

FOREIGN PATENT DOCUMENTS

| | | |
|---|---|---|
| JP | 2008-015336 A | 1/2008 |
| KR | 10-2009-0032623 A | 4/2009 |

(Continued)

OTHER PUBLICATIONS

International Search Report in International Application No. PCT/KR2010/001799, filed Mar. 24, 2010.
Office Action dated Nov. 26, 2013 in Japanese Application No. 2012-533060.

*Primary Examiner* — Omar Rojas
(74) *Attorney, Agent, or Firm* — Saliwanchik, Lloyd & Eisenschenk

(57) ABSTRACT

An optical printed circuit board (PCB) and a method of fabricating the same wherein the optical PCB is mounted with an alignment pattern area whose particular area of an integral optical connection module embedded in the optical PCB is exposed, and the alignment pattern area is formed with a sill lower than a surface of the optical PCB, whereby a transmission/reception module automatically aligned via the alignment pattern area is eased to increase the alignment accuracy between an optical connection module and the transmission/reception module and to increase the efficiency of alignment.

9 Claims, 6 Drawing Sheets

(56) References Cited

U.S. PATENT DOCUMENTS 7,489,839 B2 * 2/2009 Kim et al. .................. 385/14
2004/0156576 A1 8/2004 Windover
2009/0214158 A1 8/2009 Lee et al.

FOREIGN PATENT DOCUMENTS

| KR | 10-2009-0089668 A | 8/2009 |
|----|-------------------|--------|
| KR | 10-2009-0092204 A | 8/2009 |

* cited by examiner (a)

(b)

Fig. 6
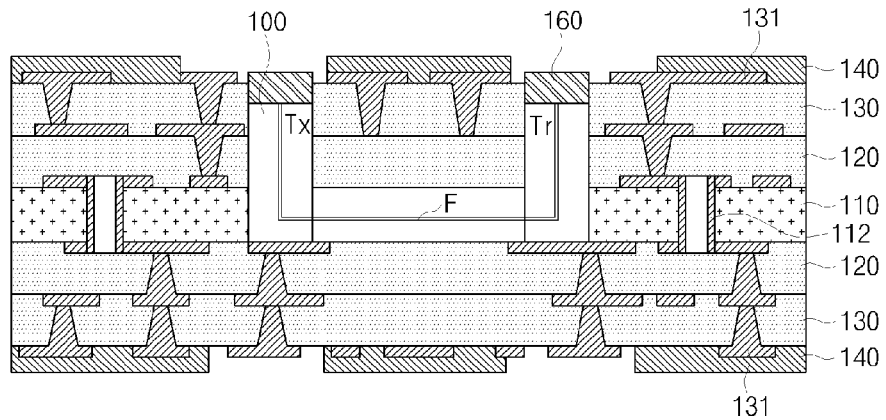
Fig. 7
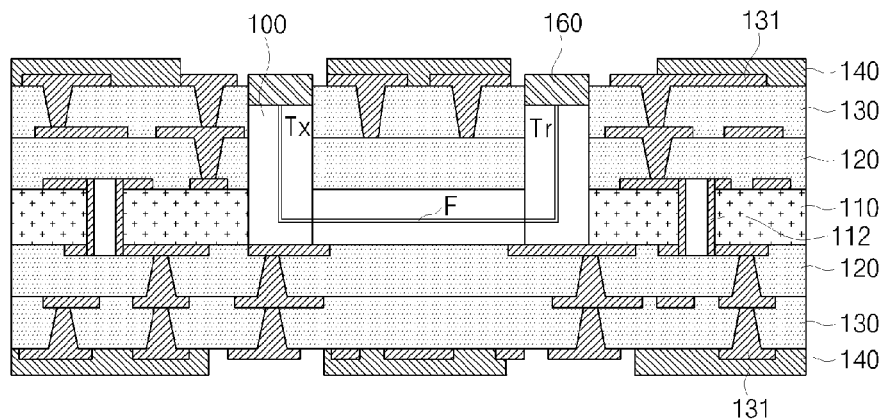
Fig. 8
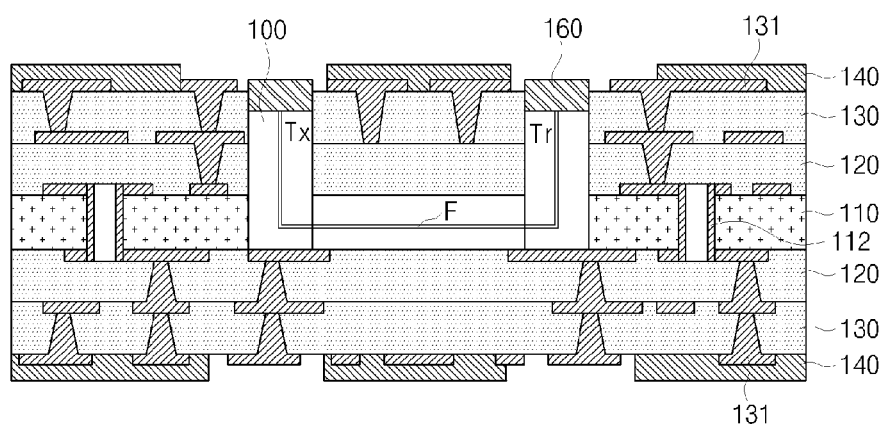
[Fig. 9]
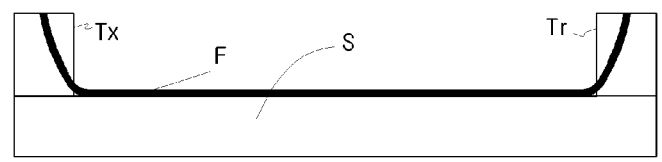

OPTICAL PRINTED CIRCUIT BOARD AND METHOD OF FABRICATING THE SAME

CROSS-REFERENCE TO RELATED APPLICATIONS

This application is the U.S. national stage application of International Patent Application No. PCT/KR2010/006870, filed Oct. 7, 2010, which claims priority to Korean Application No. 10-2009-0094991, filed Oct. 7, 2009, the disclosures of each of which are incorporated herein by reference in their entirety.

TECHNICAL FIELD

The present disclosure relates to an optical printed circuit board (PCB) and a method of fabricating the same.

BACKGROUND ART

Generally, PCBs (printed circuit boards) have a structure that includes copper wiring laminated on a plastic board made of epoxy resin, polyimide resin, or phenol resin. In other words, the PCBs (printed circuit board) are used for electrical signal transmission in which a substrate embedded with a copper thin film circuit is coated and installed with various components. However, the conventional electrical PCB has limitations in signal transmission due to failure of the electrical signal transmission capability to catch up with processing capability of parts (electrical elements). Particularly, the electrical signal is sensitive to external environment and generates noises caused by electromagnetic interference to pose a great obstacle to electrical products that require high precisions, thus countermeasures against the noises are needed.

To solve these problems, an optical PCB has been developed using an optical waveguide dispensing with a metal circuit such as a copper in the electrical PCB to enable production of high precision, stable and sophisticated devices robust to electrical wave intervention and noise.

FIG. 1 is a schematic view illustrating a structure of an optical PCB according to prior art, where the optical PCB includes a passive optical element (6) including an active optical element (5) for optical connection, an optical connection block (1) and an optical waveguide (10).

Particularly, a separate PCB (3) for mounting optical transmission and reception elements (5, 6, 7, 8) is formed, where connection of the optical connection block (1) with an optical PCB (4), light emitting and receiving elements (5, 6) is implemented by a guide pin (2).

However, there is a disadvantage in the conventional structure in that noises may occur in a line connecting an electrical signal between a separate PCB (3) and the optical PCB (4), and an alignment error is inevitably generated among the light emitting element (5), the light receiving element (6) and an optical connection block (101), or between the optical connection block (1) and an optical waveguide (210) between the optical connection block (1) and the PCB (4).

Another disadvantage is that detachment or deformation may occur due to vibration or temperature change when a guide pin (202) is used.

DISCLOSURE OF INVENTION

Technical Problem

The present disclosure is proposed to provide an optical printed circuit board (PCB) and a method of fabricating the same wherein the optical PCB is mounted with an alignment pattern area whose particular area of an integral optical connection module embedded in the optical PCB is exposed, and the alignment pattern area is formed with a sill lower a surface of the optical PCB, whereby a transmission/reception module automatically aligned via the alignment pattern area is eased to increase the alignment accuracy between an optical connection module and the transmission/reception module and to increase the efficiency of alignment.

The present disclosure is also proposed to provide a structure of an optical printed circuit board (PCB) wherein the optical PCB is mounted with a support unit configured to support an optical waveguide portion comprising an integral optical connection module for embedment in the optical PCB, whereby an optical PCB configured to stably protect the optical waveguide within the PCB process applied with heat and pressure is provided to promote mechanical coupling stability of each module.

Solution to Problem

In one general aspect of the present disclosure, an optical PCB comprises: a printed circuit board mounted with at least one or more inner layers and a circuit pattern electrically connecting the inner layer; an integral optical connection module integrally formed with an optical transmission unit embedded in the printed circuit board and an optical reception unit connected to an optical waveguide; and an alignment pattern area from which a partial area of the integral optical connection module is exposed, wherein the alignment pattern area is formed lower than a surface of the printed circuit board.

In some exemplary embodiments of the present disclosure, the alignment pattern area is preferably formed with at least one or more concave patterns lower than a horizontal surface of an extreme peripheral surface of the PCB.

In some exemplary embodiments of the present disclosure, the alignment pattern area may be formed with a depth as maximum as the depth of the extreme peripheral inner layer of the printed circuit board based on an extreme surface layer of the printed circuit board.

In some exemplary embodiments of the present disclosure, the optical PCB may further comprise a transmission/reception module inserted into the alignment pattern area and automatically aligned and mounted with the integral optical connection module, and the transmission/reception module and the integral optical connection module may be configured to be secondarily aligned through a guide pin.

In some exemplary embodiments of the present disclosure, the transmission/reception module may include an E/O (electro optical) converter or an optical Electro (O/E) converter, wherein the transmission/reception module may be lower than the surface of the printed circuit board.

In another general aspect of the present disclosure, a method of fabricating an optical printed circuit board (PCB), the method comprising: forming a base inner layer formed with a circuit pattern on an insulation layer (first step); embedding an integral optical connection module in an embedded pattern formed by processing the base inner layer or an inner layer on the base inner layer (second step); forming at least one or more inner layers at an area except for an area formed with the integral optical connection module, each electrically connected (third step); and forming an alignment pattern area by processing a surface of the inner layer of the extreme periphery (fourth step).

In some exemplary embodiments of the present disclosure, the second step may be a step in which an embedment pattern is formed by using a pattern forming method using a mechanical processing of the base inner layer or an inner layer on the base inner layer or a photolithography.

In some exemplary embodiments of the present disclosure, the third step may be a step in which formation of an inner layer of the extreme periphery among the inner layers is formed to be higher than a vertical height of the integral optical connection module.

In some exemplary embodiments of the present disclosure, the fourth step is a step in which the alignment pattern area is a concave pattern having a sill lower than a surface of the extreme peripheral inner layer, wherein the processing of the alignment pattern area may be performed through an etching patterning using a mechanical processing or a photolithography.

In some exemplary embodiments of the present disclosure, the alignment pattern area is preferably performed to expose a partial surface of the integral optical connection module.

In some exemplary embodiments of the present disclosure, the alignment pattern area may be formed with a sill lower than a surface of an extreme peripheral inner layer, and the method may further comprise forming a transmission/reception module inserted into the alignment pattern area to be automatically and mounted with the integral optical connection module (fifth step).

In still another general aspect of the present disclosure, an optical PCB comprises: a printed circuit board mounted with at least one or more inner layers and a circuit pattern electrically connecting the inner layer; and an integral optical connection module integrally formed with an optical transmission unit embedded in the printed circuit board and an optical reception unit connected to an optical waveguide; wherein the support unit is configured in such a manner that the optical waveguide is arranged on an upper surface of the support unit, or may accommodate the waveguide therein.

In some exemplary embodiments of the present disclosure, the integral optical connection module mounted with the support unit may be embedded in the printed circuit board, wherein a surface of the optical PCB may be formed with an alignment pattern area having a sill structure from which a particle area of the integral optical connection module is exposed.

In some exemplary embodiments of the present disclosure, the integral optical connection module mounted with the support unit may be embedded in the printed circuit board, wherein the integral optical connection module may be entirely embedded in an inner layer of the printed circuit board, and wherein the integral optical connection module may be aligned and mounted with a transmission/reception terminal and may further include a transmission/reception module that is also embedded into the printed circuit board.

In a case the optical PCB mounted with the optical connection module integrally mounted with the support unit is formed to have a structure mounted with alignment pattern, the alignment pattern area is preferably formed with at least one or more sill structures lower than a horizontal surface of an extreme peripheral surface of the printed circuit board, and more preferably, the alignment pattern area may be formed with a depth as maximum as the depth of the extreme peripheral inner layer of the printed circuit board based on an extreme surface layer of the printed circuit board.

In a case the optical PCB mounted with the optical connection module integrally mounted with the support unit is formed to have a structure mounted with alignment pattern, the optical PCB may further comprise a transmission/reception module embedded into the alignment pattern area and automatically aligned and mounted with the integral optical connection module, the transmission/reception module and the integral optical connection module may be configured to be secondarily aligned through a guide pin, the transmission/reception module may include an E/O (electro optical) converter or an optical Electro (O/E) converter, and the transmission/reception module may be lower than the surface of the printed circuit board.

Advantageous Effects of Invention

The optical printed circuit board (PCB) and a method of fabricating the same according to the present disclosure is advantageous in that the optical PCB is mounted with an alignment pattern area whose particular area of an integral optical connection module embedded in the optical PCB is exposed, and the alignment pattern area is formed with a sill lower a surface of the optical PCB, whereby a transmission/reception module automatically aligned via the alignment pattern area is eased to increase the alignment accuracy between an optical connection module and the transmission/reception module and to increase the efficiency of alignment.

Particularly, the present disclosure is advantageously mounted with a structure of the transmission module and the reception module is embedded in a sill possessed by the alignment pattern area to thereby promote mechanical coupling stability of each module.

In addition, the present disclosure is advantageously mounted with a support unit configured to support an optical waveguide portion comprising an integral optical connection module for embedment in the optical PCB, whereby the optical waveguide is stably protected within the PCB process applied with heat and pressure.

The optical printed circuit board (PCB) and a method of fabricating the same according to the present disclosure is advantageous in that the optical PCB is mounted with an alignment pattern area whose particular area of an integral optical connection module embedded in the optical PCB is exposed, and the alignment pattern area is formed with a sill lower a surface of the optical PCB, whereby a transmission/reception module automatically aligned via the alignment pattern area is eased to increase the alignment accuracy between an optical connection module and the transmission/reception module and to increase the efficiency of alignment.

Particularly, the present disclosure is advantageously mounted with a structure of the transmission module and the reception module is embedded in a sill possessed by the alignment pattern area to thereby promote mechanical coupling stability of each module.

The optical printed circuit board (PCB) and a method of fabricating the same according to the present disclosure is advantageous in that the transmission/reception modules and the integral optical connection module are embedded in the PCB, such that the optical PCB is completed only by the electrical connection through the wire bonding, or flip chip bonding and soldering processes, whereby mechanical and connection reliability can be enhanced due to the fact that the integral optical connection module including the transmission/reception modules are embedded in the PCB.

BRIEF DESCRIPTION OF DRAWINGS

FIGS. 6, 7 and 8 are schematic cross-sectional views illustrating essential parts of an optical PCB according to another exemplary embodiment based on the first exemplary embodiment of the present disclosure;

FIGS. 9 and 10 are schematic cross-sectional views illustrating configuration of a support unit according to a second exemplary embodiment of the present disclosure.

MODE FOR THE INVENTION

Figure 1:
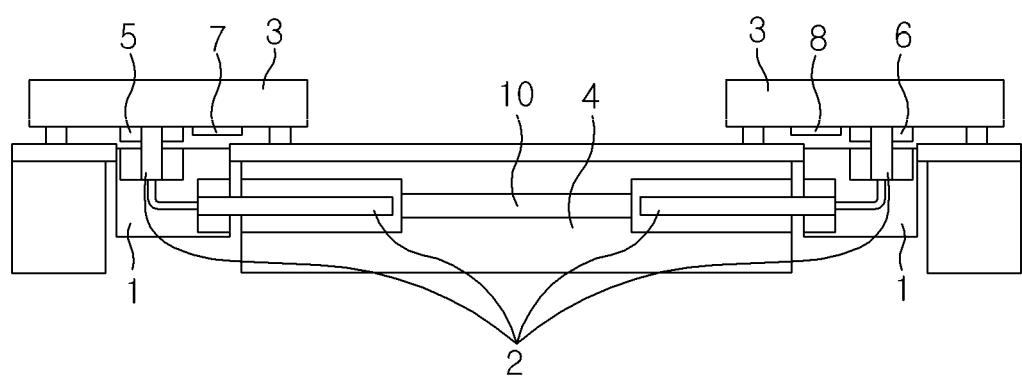
FIG. 1 is a conceptual drawing of a printed circuit board (PCB) in which the conventional optical connection system is implemented.

The exemplary embodiments of an optical PCB according to the present disclosure will be explained in detail hereinbelow together with the figures. Furthermore, the same reference numerals will be assigned to the same elements in the explanations of the figures, and explanations that duplicate one another will be omitted.

The suffixes 'module', 'unit' and 'part' may be used for elements in order to facilitate the disclosure. Significant meanings or roles may not be given to the suffixes themselves and it is understood that the module', 'unit' and 'part' may be used together or interchangeably.

The exemplary embodiments described herein detail for illustrative purposes are subject to many variations in structure and design. It should be emphasized, however, that the present disclosure is not limited to a particular disclosure, as shown and described. It is understood that various omissions and substitutions of equivalents are contemplated as circumstances may suggest or render expedient, but these are intended to cover the application or implementation without departing from the spirit or scope of the claims of the present invention.

The terms "first," "second," and the like, herein do not denote any order, quantity, or importance, but rather are used to distinguish one element from another, and the terms "a" and "an" herein do not denote a limitation of quantity, but rather denote the presence of at least one of the referenced item.

The first exemplary embodiment of the present disclosure suggests a technical subject matter in which an optical connection module comprising an optical PCB is integrally formed, the integral optical connection module is embedded in the PCB and an exposed portion of the optical connection module is formed to be lower than the PCB surface to thereby secure a mechanical stability of the optical connection system and to remove noises resultant from transmission and reception.

Figure 2:
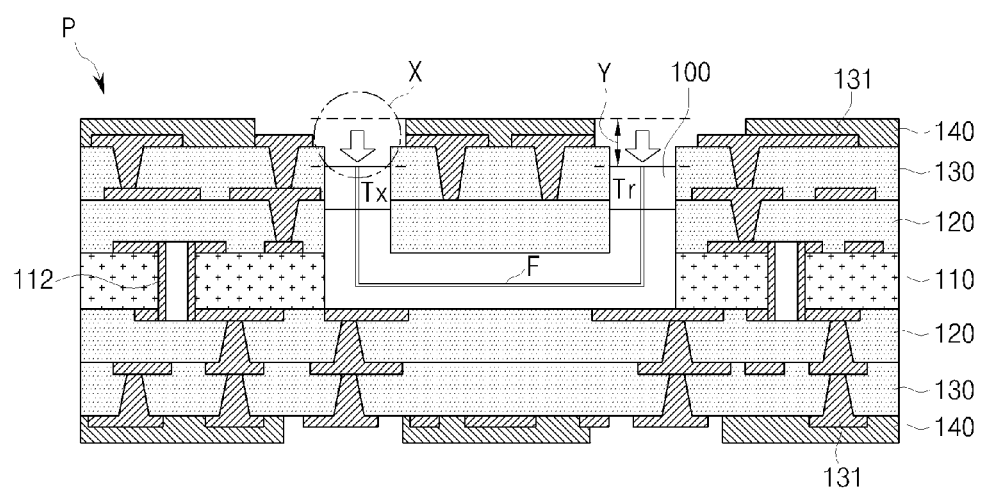
FIGS. 2 and 3 are schematic cross-sectional views illustrating essential parts of an optical PCB according to a first exemplary embodiment of the present disclosure.

FIG. 2 is a schematic cross-sectional view illustrating an inner configuration of an optical PCB according to a first exemplary embodiment of the present disclosure.

An optical PCB (P) is based on a PCB formed with at least one or more inner layers (110, 120, 130) and a PCB mounted with a circuit pattern electrically connecting the inner layers, and includes an integral optical connection module (100) integrally formed with an optical transmission unit (Tx) embedded in the PCB and an optical reception unit (Tr) connected to an optical waveguide (F), and an alignment pattern area (X) from which a partial area of the integral optical connection module (100) is exposed.

Particularly, in aligning the integral optical connection module (100), the present disclosure proposes a subject matter in which a partial surface is exposed from the alignment pattern area (X) mounted with a pattern area lower than the surface of the optical PCB (P). Therefore, the alignment pattern area (X) is preferably formed with a concave sill lower than the surface of the optical PCB.

To be more specific, the inner layer comprising the optical PCB according to the present disclosure may have one layer or a plurality of layers. The present disclosure illustrates an exemplary embodiment of a structure disposed with a plurality of layers. Each inner layer is connected by a base inner layer (110), a conduction hole (112) or a bump (122) electrically conducted with at least one or more inner layers thereon and thereunder, and the base inner layer (110) and other inner layers are formed with the integral optical connection modules (100).

The integral optical connection module (100) is integrally formed with the optical transmission unit (Tx), the optical reception unit (Tr), and the optical waveguide (F) that connects the optical transmission unit (Tx) and the optical reception unit (Tr). Preferably, the integral optical connection module (100) is formed to protect the optical waveguide against the outside using an outside member such as a support member. The optical waveguide may employ an optical fiber configured to transmit and receive an optical signal. Particularly, surfaces of the optical transmission unit and the optical reception unit comprising an end portion of the integral optical connection module are exposed to the outside of the PCB.

Therefore, the integral optical connection module (100) according to the present disclosure is preferable to be formed with an alignment pattern area (X) mounted with a pattern area lower than the surface of the optical PCB (P). Preferably, the alignment pattern area (X) is formed with a concave sill lower than the surface of the optical PCB.

In addition, the alignment pattern area (X) is formed with a concave space such that surfaces of the optical transmission unit and the optical reception unit comprising an end portion of the integral optical connection module formed across the integral optical connection module embedded in the optical PCB are exposed to the outside of the PCB. The alignment pattern area is preferably formed with a depth (Y) as maximum as the depth of an extreme peripheral inner layer (130) of the PCB based on an extreme surface layer (140) of the PCB.

Conventionally, the transmission/reception modules are mounted at the same height as that of the surface of the PCB or mounted on the surface of the PCB, such that it was inevitable to be unnecessarily mounted with a pin hole alignment for fixing a guide pin, which leads to incessant problems of decreased mechanical strength caused by weakness of fixation power of transmission/reception modules that are fixed by only a guide pin and delay of fabricating process caused by defects resultant from misalignment.

The presence of the alignment pattern area (X) is advantageous in that convenience of alignment and mechanical strength can be simultaneously secured if the transmission/reception modules are mounted at the optical transmission unit and the optical reception unit, the detailed explanation of which will be provided later.

Figure 3:
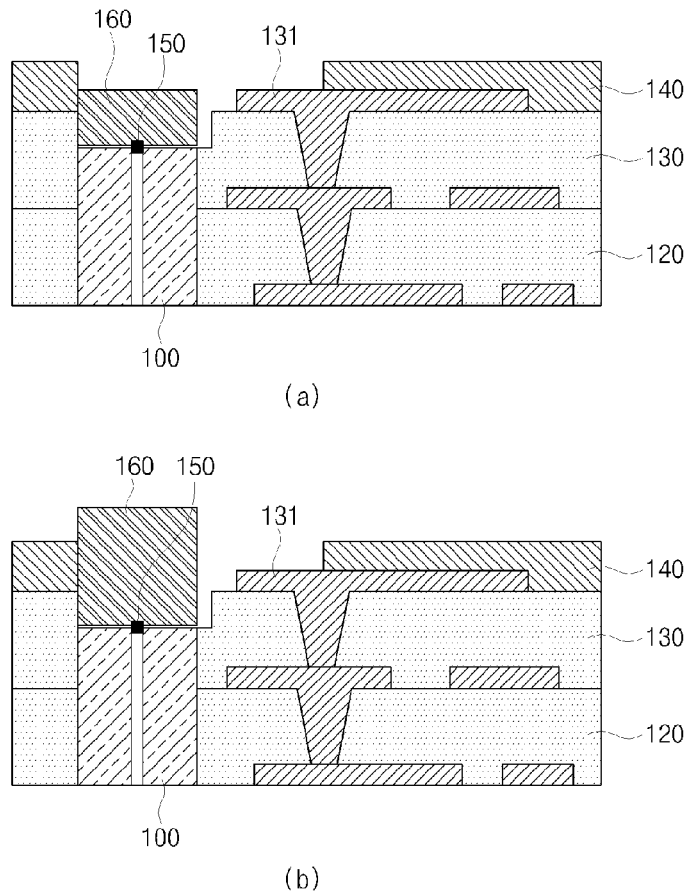

FIG. 3 is an enlarged view of essential parts illustrating the alignment pattern area (X) according to the present disclosure.

Referring to FIG. 3(a), the alignment pattern area (X) is formed with a concave shape having a sill lower than the surface of the optical PCB, under which the optical transmission unit or the optical reception unit of the integral optical connection module is exposed. The optical transmission unit or the optical reception unit may be formed with a transmission/reception module (160). The transmission/reception module (160) may be also embedded lower than the surface of the optical PCB due to the sill of the alignment pattern area (X).

Referring to FIG. 3 (b), only part of the transmission/reception module (160) may be embedded in some exemplary embodiments. That is, the integral optical connection module (100) is mounted lower than the surface of the PCB, and part of the transmission/reception module is inserted into the alignment pattern area, whereby the part of the transmission/reception module is protruded above the surface of the PCB.

In any exemplary embodiments, the part of the transmission/reception module is automatically inserted into the sill area of the alignment pattern area without any separate alignment, and is secondarily connected to the integral optical connection module through a guide pin (150).

The presence of the alignment pattern area (X) dispenses with a separate alignment, in a case the optical transmission and reception units are mounted to the transmission/reception module, and enables an automatic alignment function in which the part of the transmission/reception module is inserted right into the alignment pattern area, whereby aligning efforts are saved, and mechanical strength can be secured by the coupling power, because the transmission/reception module is embedded in the alignment pattern area compared with coupling using the guide pin only.

Figure 4:
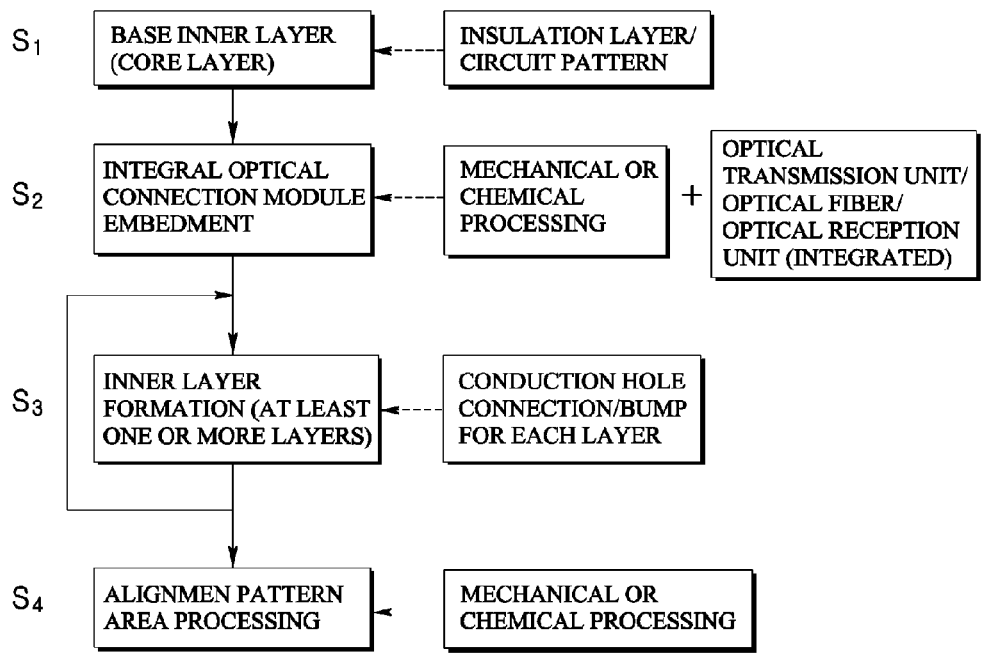
FIGS. 4 and 5 are schematic views illustrating a fabricating method of an optical PCB according to a first exemplary embodiment of the present disclosure.
Figure 5:
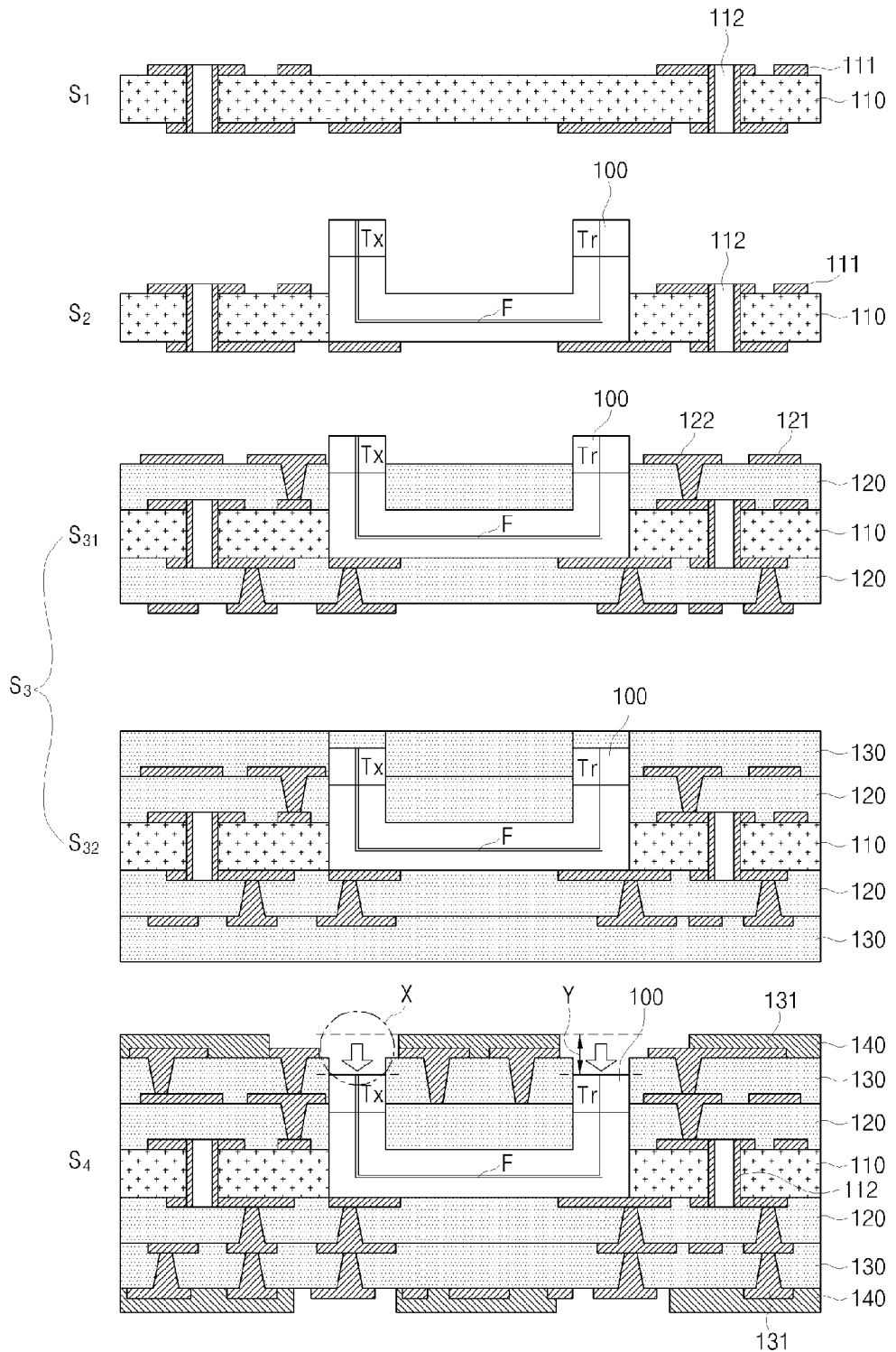

FIGS. 4 and 5 are schematic views illustrating a flowchart and a process conceptual diagram of an optical PCB according to a first exemplary embodiment of the present disclosure.

A method of fabricating an optical printed circuit board (PCB) is largely comprised of: forming a base inner layer formed with a circuit pattern on an insulation layer (first step); embedding an integral optical connection module in an embedded pattern formed by processing the base inner layer or an inner layer on the base inner layer (second step); forming at least one or more inner layers at an area except for an area formed with the integral optical connection module, each electrically connected (third step); and forming an alignment pattern area by processing a surface of the inner layer of the extreme periphery (fourth step).

The second step of forming an embedment pattern by processing may be formed by first hand processing of the base inner layer or by processing another inner layer laminated on an upper surface of the base inner layer. Now, exemplary embodiments of forming an embedded pattern by processing the base inner layer will be explained. A detailed process will be given as below:

First of all, a base inner layer (110) forming a core layer is formed at the first step (S1). The base inner layer (110) is formed with a conduction hole (112) for electrically connecting with another inner layer, and a circuit pattern is formed.

Successively, the integral optical connection module (100) is embedded by a mechanical or chemical process of the base inner layer (110) at second step (S2). The integral optical connection module (100) may be integrally formed with the optical transmission unit and the optical reception unit through an optical waveguide, and may be formed with a support unit at the outside. Furthermore, the mechanical process may employ a drilling method using a laser drill while the chemical process may employ a patterning method using a photolithography.

Now, at least one or more inner layers (110, 120) are formed at an area except for an area formed with the integral optical connection module (100) (S3). The at least one or more inner layers (110, 120) may be formed by coating an insulation layer on an upper surface of the base inner layer (110), processing a copper layer to form a circuit pattern (121) (S31) and coating the insulating layer (130) again to form the circuit pattern (S32). It should be apparent that the formation of inner layers is made by lamination of multiple layers through repeated processes. However, in any exemplary embodiments, the optical transmission unit and the optical reception unit, which are end portion of the integral optical connection module, should be inserted into the extreme peripheral inner layer.

Successively, the insulation layer (130) for forming an extreme peripheral inner layer, a circuit pattern (131) formed thereon and a solder resist layer (140) for protection of the circuit pattern are formed (S4).

Successively, the alignment pattern area (x) is formed using mechanical/chemical processing methods. The alignment pattern area (x) is a pattern having a sill lower than the surface of the extreme peripheral layer of the entire optical PCB and may be formed by mechanical or chemical processing method. Furthermore, the surfaces of the optical transmission unit (Tx) and the optical reception unit (Tr), which are end portion of the integral optical connection module (100), should be exposed in the processing method.

Thereafter, the transmission/reception module can be easily mounted using the alignment pattern area (x) as a base for the automatic alignment. Once the mounting is finished, the integral optical connection module and the transmission/reception modules are all embedded in the PCB or part of the integral optical connection module and the transmission/reception modules are embedded to solve the breakage caused by external shock or the disengagement and to obviate the generation of noises during signal transmission.

FIGS. 6, 7 and 8 are schematic cross-sectional views illustrating essential parts of an optical PCB according to another exemplary embodiment based on the first exemplary embodiment of the present disclosure.

As explained in the foregoing, the transmission/reception module is mounted at the alignment pattern area of the optical PCB to allow part of the transmission/reception module to be inserted into the optical PCB, while another part may be protruded higher than the surface, or an entire of the transmission/reception module may be embedded into the optical PCB.

The exemplary embodiment in FIG. 6 illustrates another structure of the integral optical connection module. To be more specific, a block structure comprising an optical transmission unit (Tx) and an optical reception unit (Tr) is inserted further into a base inner layer, and a waveguide connecting the two units is formed. At the same time, the transmission/reception module (160) is formed to be lower than the surface of the optical PCB.

FIG. 7 illustrates an exemplary embodiment in which only part of the transmission/reception module (160) is inserted into the optical PCB while the other part is protruded above the surface of the optical PCB in the structure of FIG. 6.

FIG. 8 illustrates another exemplary embodiment in which the embedded pattern of embedding the integral optical connection module is formed inside an inner layer (120) at an upper surface of the base inner layer, instead of the base inner layer (110). It should be apparent that surface of the optical transmission/reception units across the integral optical connection module is lower than the surface of the optical PCB.

The second exemplary embodiment of the present disclosure has a subject matter in which an optical connection module comprising the optical PCB is integrated that includes a support unit to remove a breakage risk of the optical waveguide in the PCB fabricating process, whereby structural stability can be secured.

Furthermore, the integral optical connection module including the support unit is embedded in the PCB and an exposed portion of the optical connection module is formed to be lower than the surface of the PCB to thereby secure a mechanical stability of the entire optical connection system, and to obviate the generation of noises.

Figure 10:
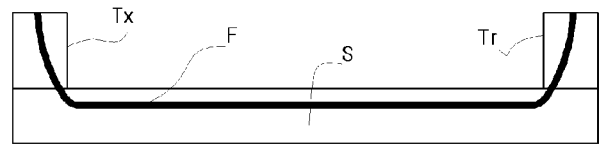

FIGS. 9 and 10 are schematic cross-sectional views illustrating configuration of a support unit according to a second exemplary embodiment of the present disclosure.

The integral optical connection module according to the second exemplary embodiment of the present disclosure is structured to be in integral connection between an optical transmission unit (Tx) and an optical reception unit (Tr) connected to an optical waveguide (F).

The optical transmission unit (Tx) may correspond to an optical transmission element configured to transmit an optical signal such as a semiconductor laser, and the optical reception unit (Tr) may correspond to an optical reception element such as a photo diode configured to receive an optical signal transmitted from the optical transmission unit through an optical waveguide. Each of the optical transmission unit and the optical reception unit may be formed in a block structure configured to protect the elements and the optical waveguide.

Particularly, the support unit (S), which is a structure configured to support the optical waveguide (F), may be implemented in a structure configured to support optical transmission/reception blocks and to support the optical waveguide from under (FIG. 2a), or may be implemented in a structure to accommodate the optical waveguide to allow the optical waveguide to pass through the support unit (FIG. 2b).

The support unit serves to protect the optical waveguide which is relatively weak to heat and pressure when the PCB is manufactured. Furthermore, the support unit or the block structure of optical transmission/reception units is filled therein with thermosetting resin such as epoxy to enhance the structural stability.

Figure 11:
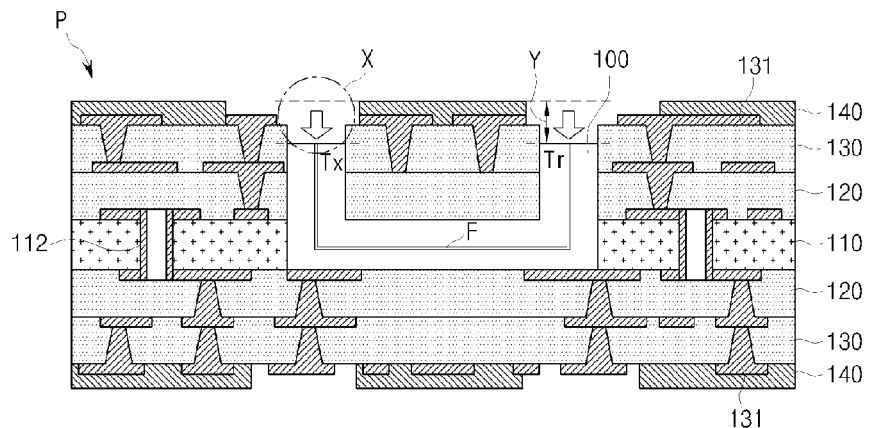
FIGS. 11, 12 and 13 are schematic cross-sectional views illustrating an optical PCB applied with an integral optical connection module including a support unit according to a second exemplary embodiment of the present disclosure.

FIG. 11 is a schematic cross-sectional view illustrating an optical PCB applied with an integral optical connection module including a support unit according to a second exemplary embodiment of the present disclosure.

The optical PCB (P) according to the present embodiment is based on a PCB formed with at least one or more inner layers (110, 120, 130) and a PCB mounted with a circuit pattern electrically connecting the inner layers, and includes an integral optical connection module (100) integrally formed with an optical transmission unit (Tx) embedded in the PCB and an optical reception unit (Tr) connected to an optical waveguide (F), and a support unit supporting the optical transmission unit (Tx), the optical reception unit (Tr) and the optical waveguide (F).

Furthermore, the optical PCB includes an alignment pattern area (X) from which a partial area of the embedded integral optical connection module (100) is exposed.

Particularly, the present disclosure has a subject matter in which, in aligning the integral optical connection module (100), a partial surface of the integral optical connection module is exposed from the alignment pattern area (X) disposed with a pattern area having a surface lower than the surface of the optical PCB (P). Therefore, the alignment pattern area (X) is preferably configured to have a concave sill lower than the surface of the optical PCB.

To be more specific, the inner layer comprising the optical PCB according to the present disclosure may be structured with a singular layer or with a plurality of layers. The present exemplary embodiment is structured with a plurality of inner layers.

Each inner layer is connected by a base inner layer (110), a conduction hole (112) or a bump (122) electrically conducted with at least one or more inner layers thereon and thereunder, and the base inner layer (110) and other inner layers are formed with the integral optical connection modules (100).

The integral optical connection module (100) is integrally formed with the optical transmission unit (Tx), the optical reception unit (Tr), and the optical waveguide (F) that connects the optical transmission unit (Tx) and the optical reception unit (Tr). Preferably, the integral optical connection module (100) is so formed as to protect the optical waveguide against the outside using an outside member such as a support member. Particularly, surfaces of the optical transmission unit and the optical reception unit comprising an end portion of the integral optical connection module are exposed to the outside of the PCB.

Therefore, the integral optical connection module (100) according to the present disclosure is preferable to be formed with an alignment pattern area (X) mounted with a pattern area lower than the surface of the optical PCB (P). Preferably, the alignment pattern area (X) is preferably formed with a concave sill lower than the surface of the optical PCB.

In addition, the alignment pattern area (X) is formed with a concave space such that surfaces of the optical transmission unit and the optical reception unit comprising an end portion of the integral optical connection module formed across the integral optical connection module embedded in the optical PCB are exposed to the outside of the PCB. The alignment pattern area is preferably formed with a depth (Y) as maximum as the depth of an extreme peripheral inner layer (130) of the PCB based on an extreme surface layer (140) of the PCB.

Conventionally, the transmission/reception modules are mounted at the same height as that of the surface of the PCB or mounted on the surface of the PCB, such that it was inevitable to be unnecessarily mounted with a pin hole alignment for fixing a guide pin, which leads to incessant problems of decreased mechanical strength caused by weakness of fixation power of transmission/reception modules that are fixed by only a guide pin and delay of fabricating process caused by defects resultant from misalignment.

The presence of the alignment pattern area (X) is advantageous in that convenience of alignment and mechanical strength can be simultaneously secured if the transmission/reception modules are mounted at the optical transmission unit and the optical reception unit. That is, the sill at the alignment pattern area allows the transmission/reception modules to be embedded lower than the surface of the optical PCB. In some exemplary embodiments, only part of the transmission/reception module may be embedded.

Under any circumstances, the transmission/reception module can be automatically embedded or inserted in the sill of the alignment pattern area without any separate alignment, and be secondarily connected to the integral optical connection module again through the guide pin (150).

The presence of the alignment pattern area (X) dispenses with the separate alignment and implements an automatic alignment function in which the transmission/reception module can be automatically embedded or inserted in the sill of the alignment pattern area, whereby efforts to have an alignment are saved, and mechanical strength is reinforced by the structure where the transmission/reception module is embedded in the alignment pattern area in comparison to coupling by the guide pin alone.

Figure 12:
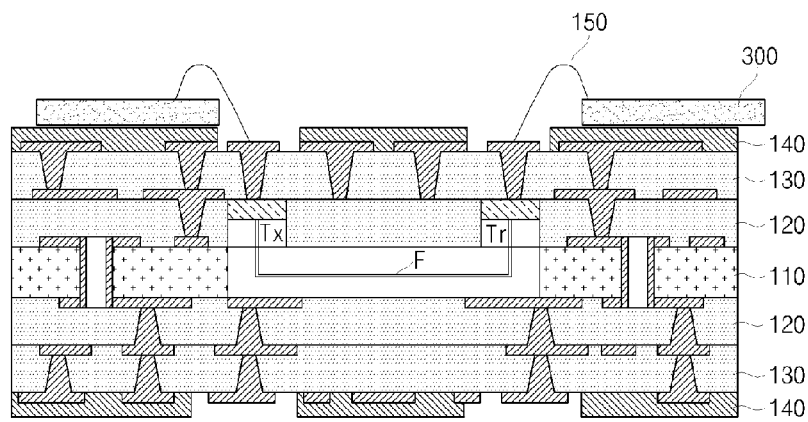

FIG. 12 is a schematic cross-sectional view illustrating an optical PCB applied with an integral optical connection module including a support unit according to another exemplary embodiment of the present disclosure.

The optical PCB (P) according to the present embodiment is based on a PCB formed with at least one or more inner layers (110, 120, 130) and a PCB mounted with a circuit pattern electrically connecting the inner layers, and includes an integral optical connection module (100) that is embedded in the PCB and is integrally formed with an optical transmission unit (Tx) and an optical reception unit (Tr) connected to an optical waveguide (F), and a support unit supporting the optical transmission unit (Tx), the optical reception unit (Tr) and the optical waveguide (F).

The optical transmission unit and the optical reception unit of the integral optical connection module (100) may further include a transmission/reception module (200) thereon, and the transmission/reception module is also embedded in the PCB. The transmission/reception module (200) is electrically connected to an outside control circuit unit (300) through inner layers laminated on the transmission/reception module, a conduction bump and a wire (150).

Figure 13:
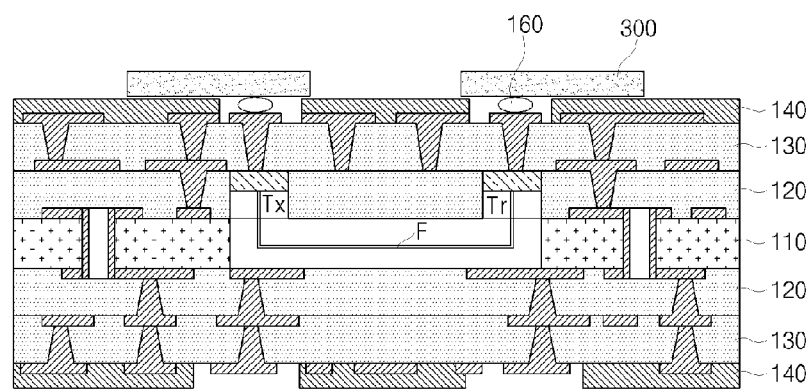

FIG. 13 is a schematic cross-sectional view illustrating the transmission/reception module (200) being electrically connected to an outside control circuit unit (300) through inner layers laminated on the transmission/reception module, a conduction bump and a flip chip bonding.

According to the present exemplary embodiments disclosed by FIGS. 11, 12 and 13, the breakage of an optical waveguide in the integral optical connection module is prevented by the presence of the support unit, and furthermore, the transmission/reception module including the E/O, O/E converters coupled to the transmission/reception portions, the transmission/reception portions of the integral optical connection module and the optical fiber is integrated and embedded in the PCB, such that this structure according to the present exemplary embodiments has the same one as that of the convention PCB that performs an electrical connection, when the optical PCB is completed.

Particularly, integral embedment of the integral optical connection module and the transmission/reception modules assembled thereon into the optical PCB can enhance the connection reliability.

Furthermore, to a user, no assembly related to optical transmission/reception is needed to enable an optical connection by only performing an electrical assembly the same as that of the conventional PDB, when the optical PCB is completed.

Still furthermore, the optical PCB according to the present disclosure is such that the transmission/reception portions are embedded in the PCB to enable a mechanical stability, as compared with the conventional structure where the transmission/reception portions are exposed to the outside.

Although the present disclosure has been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The present disclosure may provide an industrial applicability to an optical printed circuit board capable of enhancing an alignment accuracy and work efficiency between an optical connection module and a transmission/reception module.

The invention claimed is:

1. An optical PCB comprises:
a printed circuit board including a surface, at least one inner layer, and a circuit pattern electrically connecting the inner layers;
an integral optical connection module integrally formed with an optical transmission unit embedded in the primed circuit board and an optical reception unit connected to an optical waveguide; and
a transmission/reception module embedded into an alignment pattern area and automatically aligned and mounted with the integral optical connection module,
wherein the integral optical connection module further includes a support unit for supporting a formation portion of the optical waveguide,
wherein the surface of the optical printed circuit board is formed with the alignment pattern area having a sill structure from which a partial area of the integral optical connection module is exposed, and
wherein the support unit is filled with thermosetting resin to enhance structural stability.

2. The optical PCB of claim 1, wherein the support unit is configured in such a manner that the optical waveguide is arranged on an upper surface of the support unit, or may accommodate the waveguide therein.

3. The optical PCB of claim 1, wherein the integral optical connection module is entirely embedded in an inner layer of the printed circuit board.

4. The optical PCB of claim 1, wherein the alignment pattern area is formed with at least one or more sill structures lower than a horizontal surface of an extreme peripheral surface of the printed circuit board.

5. The optical PCB of claim 1, wherein the alignment pattern area is formed with a depth as maximum as the depth of an outermost inner layer of the at least one inner layer of the printed circuit board based on an extreme surface layer of the printed circuit board.

6. The optical PCB of claim 1, wherein the transmission/reception module and the integral optical connection module are configured to be secondarily aligned through a guide pin.

7. The optical PCB of claim 6, wherein the transmission/reception module includes an E/O (electro optical) converter or an optical Electro (O/E) converter.

8. The optical PCB of claim 7, wherein the transmission/reception module is lower than the surface of the printed circuit board.

9. The optical PCB of claim 3, wherein the integral optical connection module further comprises a transmission/reception module aligned on a transmission/reception terminal.

* * * * *